(12) United States Patent
Sauerbier et al.

(10) Patent No.: US 8,895,871 B2
(45) Date of Patent: Nov. 25, 2014

(54) CIRCUIT BOARD HAVING A PLURALITY OF CIRCUIT BOARD LAYERS ARRANGED ONE OVER THE OTHER HAVING BARE DIE MOUNTING FOR USE AS A GEARBOX CONTROLLER

(75) Inventors: Juergen Sauerbier, Dachsbach (DE);
Wolfgang Gruebl, Winkelhaid (DE);
Bernhard Schuch, Neusitz (DE);
Hubert Trageser, Igensdorf (DE);
Hermann-Josef Robin, Regensburg (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 207 days.

(21) Appl. No.: 13/515,907

(22) PCT Filed: Oct. 15, 2010

(86) PCT No.: PCT/DE2010/001209
§ 371 (c)(1),
(2), (4) Date: Jul. 30, 2012

(87) PCT Pub. No.: WO2011/072629
PCT Pub. Date: Jun. 23, 2011

(65) Prior Publication Data
US 2012/0287581 A1 Nov. 15, 2012

(30) Foreign Application Priority Data

Dec. 17, 2009 (DE) .................. 10 2009 058 914
Dec. 17, 2009 (DE) .................. 10 2009 058 915

(51) Int. Cl.
*H05K 1/11* (2006.01)
*H05K 1/02* (2006.01)
*H05K 1/03* (2006.01)

(52) U.S. Cl.
CPC ............ *H05K 1/0206* (2013.01); *H05K 1/0373* (2013.01); *H05K 2201/0209* (2013.01)
USPC ............................ 174/262; 361/720; 361/748

(58) Field of Classification Search
CPC .............. H05K 1/0206; H05K 1/0373; H05K 2201/0209
USPC .......... 174/252, 253, 259, 260, 262; 361/748, 361/760, 720
See application file for complete search history.

(56) References Cited

U.S. PATENT DOCUMENTS

| 4,335,180 A | 6/1982 | Traut |
| 4,700,473 A | 10/1987 | Freyman et al. |

(Continued)

FOREIGN PATENT DOCUMENTS

| CA | 2090546 | 8/1993 |
| DE | 43 03 824 | 8/1994 |

(Continued)

OTHER PUBLICATIONS

PCT Examiner Hartwig Poth, International Search Report of the International Searching Authority for International Application PCT/DE2010/001209, mailed Mar. 29, 2011, 3 pages, European Patent Office, HV Rijswijk, Netherlands.

(Continued)

*Primary Examiner* — Yuriy Semenenko
(74) *Attorney, Agent, or Firm* — W. F. Fasse

(57) ABSTRACT

A circuit board has a plurality of circuit board layers that are arranged one over the other, and that each include an electrically insulating base material having a glass transition temperature greater than or equal to 170° C. The circuit board layers each further have at least one thermally conductive layer applied to the base material. Several vias extend through respective ones of the circuit board layers to connect thermally conductive layers of different circuit board layers, such that the vias and the thermally conductive layers form a thermally conductive bridge from a topmost circuit board layer to a bottommost circuit board layer.

20 Claims, 3 Drawing Sheets

(56) References Cited

U.S. PATENT DOCUMENTS

| | | | |
|---|---|---|---|
| 4,965,660 A * | 10/1990 | Ogihara et al. | 257/717 |
| 5,275,330 A | 1/1994 | Isaacs et al. | |
| 5,407,864 A | 4/1995 | Kim | |
| 5,458,978 A | 10/1995 | Boettcher | |
| 5,571,609 A | 11/1996 | St. Lawrence et al. | |
| 5,858,887 A | 1/1999 | St. Lawrence et al. | |
| 5,883,335 A | 3/1999 | Mizumoto et al. | |
| 5,972,811 A | 10/1999 | St. Lawrence et al. | |
| 6,190,941 B1 | 2/2001 | Heinz et al. | |
| 6,400,573 B1 | 6/2002 | Mowatt et al. | |
| 6,611,055 B1 | 8/2003 | Hashemi | |
| 6,820,798 B1 | 11/2004 | Heinz et al. | |
| 6,929,975 B2 | 8/2005 | Heinz et al. | |
| 6,953,999 B2 | 10/2005 | Strandberg et al. | |
| 8,039,752 B2 | 10/2011 | Yanbe et al. | |
| 2004/0048414 A1* | 3/2004 | Heinz et al. | 438/106 |
| 2004/0124002 A1 | 7/2004 | Mazzochette et al. | |
| 2005/0151240 A1* | 7/2005 | Takeda et al. | 257/700 |
| 2006/0091527 A1* | 5/2006 | Tsai et al. | 257/706 |
| 2006/0289202 A1* | 12/2006 | Takeuchi et al. | 174/262 |
| 2007/0018312 A1* | 1/2007 | Jo | 257/720 |
| 2007/0216274 A1* | 9/2007 | Schultz et al. | 313/46 |
| 2008/0170372 A1 | 7/2008 | Kirigaya | |
| 2008/0192445 A1* | 8/2008 | Meyer | 361/748 |
| 2008/0283287 A1 | 11/2008 | Takahashi et al. | |
| 2009/0312474 A1* | 12/2009 | Tan et al. | 524/403 |
| 2010/0226098 A1 | 9/2010 | Loibl et al. | |

FOREIGN PATENT DOCUMENTS

| | | |
|---|---|---|
| DE | 102007032535 | 1/2009 |
| EP | 0 559 607 | 9/1993 |
| JP | 07-321471 A | 12/1995 |
| JP | 10-117052 | 5/1998 |
| JP | 2003-334886 A | 11/2003 |
| JP | 2004-140063 | 5/2004 |
| JP | 2006-339609 A | 12/2006 |
| JP | 2009-147014 A | 7/2009 |
| JP | 2009-200212 A | 9/2009 |

OTHER PUBLICATIONS

PCT International Preliminary Report on Patentability including English Translation of PCT Written Opinion of the International Searching Authority for International Application PCT/DE2010/001209, issued Jul. 4, 2012, 9 pages, International Bureau of WIPO, Geneva, Switzerland.

English translation of Japanese Office Action in Japanese Patent Application No. 2012-546358, mailed Apr. 22, 2014, 3 pages.

* cited by examiner

CIRCUIT BOARD HAVING A PLURALITY OF CIRCUIT BOARD LAYERS ARRANGED ONE OVER THE OTHER HAVING BARE DIE MOUNTING FOR USE AS A GEARBOX CONTROLLER

FIELD OF THE INVENTION

The invention relates to a circuit board having a plurality of circuit board layers arranged one over the other.

BACKGROUND INFORMATION

The fact that automotive-engineering components, such as gearbox systems, engine systems or brake systems, are controlled electronically to an increasing extent is generally known from the state of the art. To this end, there are integrated mechatronic controlling means (also referred to as on-site electronic systems) that can be created by the integration of the electronic control system and associated electronic components (e.g., sensors or valves) into the gearbox, the engine or the brake system, i.e., the electronic control system and the associated electronic components are not accommodated in a separate protected electronic-component space outside the gearbox, the engine or the brake system. In order to protect the electronic control system and the associated electronic components from environmental influences and mechanical, thermal and chemical stress, they are accommodated in special casings. In addition, said casings provide an important shielding function.

The usual structure for such integrated mechatronic controlling means consists of a ceramic substrate that includes the various electronic components of a central control unit. In order to enable peripheral components to be connected to the central control unit, the ceramic substrate is connected to rigid or flexible circuit boards or pressed screens by means of bond connections (e.g., aluminum thick-wire bond connections). Furthermore, the entire electronic-component space with the populated circuit carrier is coated with a silicone gel in order to protect the bond connections, the strip conductors and the components from moisture and other environmental influences.

When an integrated mechatronic controlling means is used as a gearbox control module, said module is accommodated in the gear oil pan so that it is completely surrounded by oil and electrically conductive contaminants contained in the oil. Said contaminants comprise contaminants that result from gear teeth abrasion, remnants of machining operations of manufacturing processes and/or from inadequate washing and cleaning processes of the gearbox casing and/or of the built-in components. In order to provide the necessary protection from such contamination, from damages and from strip-conductor or bond short circuits, a metallic, non-metallic or metallized casing cover is mounted onto a casing base plate of the gearbox control module and sealed hermetically.

In order to realize such units for gearbox control, casingless semiconductor components are mainly used. Said components are mounted on the ceramic substrate (circuit carrier) using conductive adhesives and are electrically contacted towards the circuit carrier by gold and aluminum wire bonding. The ceramic circuit carriers are realized in the form of thick-film circuits or as LTCC (Low Temperature Cofired Ceramics). With both ceramic circuit carrier technologies, strip conductors are produced by screen printing using highly argentiferous pastes. In addition, multifunctional end surfaces can be realized on the strip conductors of the circuit carrier in subsequent plating processes by means of a sequence of films (e.g., nickel, palladium and gold). At the same time, said end surfaces are suitable for connecting techniques, such as soldering, gold or aluminum wire bonding, and using conductive silver adhesives. These two ceramic circuit carrier technologies are suitable for high operating temperatures in or on the gearbox.

For heat dissipation (heat removal) of the circuit, the ceramic circuit carriers are adhesively bonded on metallic base plates or casing parts by means of a thermally conductive adhesive.

Furthermore, there are technical solutions that comprise a circuit board instead of the ceramic substrate.

Mounting the casingless semiconductor components on the circuit board by means of conductive silver adhesives and wire bonding is also referred to as chip-on-board (COB). According to this method, the semiconductor components are protected from environmental influences, such as moisture, by means of a singular glob top that is individually applied to the components. The glob top material is a polymeric resin, typically an epoxy resin with fillers such as silicon oxide. The thermal expansion of the glob top material is adapted to the thermal expansion of the circuit board, wherein the glob top material has a high modulus of elasticity. Chip-on-board applications are designed for moderate reliability requirements and temperature requirements (e.g., between −40° C. and 85° C.), whereas the typical operating-temperature range of gearbox controllers extends from −40° C. to +160° C. and higher temperatures. No applications are known for such operating-temperature ranges.

The fact that heat is removed from the components by means of thermal vias is also known from the state of the art. When mounting casingless semiconductor components (also referred to as bare dice) onto a circuit carrier (circuit board), the components (casingless semiconductor components) are conductively mounted, together with passive components, onto the surface of the circuit board by means of adhesive bonding or soldering. The component is electrically contacted to the circuit carrier by means of wire bonding. A standard circuit board technique (multilayer technique) uses thermal vias for facilitating the heat dissipation of the components, in particular of active components, said thermal vias being drilled mechanically. Thermal vias are used both for components that are accommodated in casings and for casingless components, wherein heat flows to the bottom of the circuit board via the thermal vias. A copper pad arranged on the bottom of the circuit board transfers the heat to a heat sink via the thermally conductive adhesive.

DE 10 2007 032 535 A1 describes an electronic module having a casing cover and at least one multilayer circuit board as an electrical connection between the interior of the casing and components that are arranged outside the casing. The multilayer circuit board is a circuit carrier for electronic components of a central electronic control system. At the same time, it is a thermal connection to a base plate for an integrated mechatronic gearbox controller. The circuit board has vias for providing a thermal connection to the base plate and for providing an electronic connection to the components that are arranged outside the casing.

In the integrated gearbox controllers, but also in an externally mounted control unit, the electronic components on the circuit carriers and the junctions between the electronic components and the strip conductors on the circuit carrier or between the electronic components themselves are exposed to very high levels of stress caused by temperature and vibrations. It is therefore necessary to adapt the circuit board to the requirements of the control units for gearbox control.

SUMMARY OF THE INVENTION

An object of an embodiment of the invention is to provide a circuit board having a plurality of circuit board layers arranged one over the other, said circuit board being improved as compared to the state of the art, having improved functional properties, and being at the same time manufacturable with little effort and in an economical manner. In particular, the circuit board of an embodiment of the invention should meet high-temperature, chemical-stress and mechanical-stress requirements (in particular, as far as vehicle applications are concerned) better than the solutions that are known from the state of the art. Furthermore, another object of an embodiment of the invention is to provide a control unit for vehicle applications and a use of the control unit, said control unit being improved as compared to the state of the art.

A circuit board comprises a plurality of circuit board layers arranged one over the other.

According to an embodiment of the invention, the circuit board layers are each made of a base material, the glass transition temperature of which is greater than or equal to 170° C., and the circuit board layers each have at least one thermally conductive layer applied to the electrically insulating base material, wherein several vias extending in a z-direction perpendicularly to the circuit board layers are provided, which vias connect the thermally conductive layers of different circuit board layers in such a way that the vias and the thermally conductive layers of the circuit board layers form a thermally conductive bridge from a topmost circuit board layer to a bottommost circuit board layer, wherein the thermally conductive layers serve as electrical conductors at the same time.

In particular, the circuit board is an HDI circuit board (HDI=High Density Interconnect) having bare die mounting for the use as a gearbox controller for a vehicle.

A via (Vertical Interconnect Access) is a vertical plated hole that connects at least two circuit board layers of a multilayer circuit board to each other.

Microvias are vias in the form of plated holes having a diameter of less than approximately 150 µm.

A blind via is a via in the form of a plated blind hole that connects the topmost or the bottommost circuit board layer to at least one internal circuit board layer of a multilayer circuit board.

A buried via is a via that is arranged in the interior of a multilayer circuit board and connects at least two internal circuit board layers to each other.

Thermal vias are vias that are primarily used to improve the transfer of heat through a circuit board.

Thermal vias are particularly used to remove heat from circuit boards on which heat-emitting active electrical components (e.g., casingless semiconductor components) are arranged.

Since the vias act as thermal vias by means of which heat can be removed through the various circuit board layers, the inventive realization of the circuit board advantageously results in the circuit board being designed for high operating temperatures and being suitable for integrated mechatronic applications.

According to a particularly advantageous realization of the inventive circuit board, the base material is a glass-fiber reinforced plastic material that comprises ceramic particles. These base materials can be obtained easily and cost-effectively. Circuit carrier structures may be standardized in principle. In addition, larger circuit carrier geometries may be realized or very special shapes having roundings, corners and other features may be created.

Preferably, an overall or total surface area of all thermally conductive layers of at least one selected circuit board layer is larger than an overall or total surface area of all thermally conductive layers of a circuit board layer lying above the selected layer, wherein the thermally conductive bridge that is made up of the vias and the thermally conductive layers is widened or enlarged from at least one circuit board layer to an underlying circuit board layer since the overall surface area of all thermally conductive layers of at least one circuit board layer is larger than an overall surface area of all thermally conductive layers of a circuit board layer lying above it. In this manner, the effective heat transfer area is increased advantageously and the thermal resistance of the circuit board is reduced since the thermal resistance is at least approximately proportional to the reciprocal value of the effective heat transfer area.

Alternatively or in addition, a particularly preferred realization of the circuit board provides that the size of the thermally-conductive-layer surfaces that extend perpendicularly to the z-direction increases monotonically from the topmost circuit board layer to the bottommost circuit board layer.

In the present context, a monotonic increase in the size of these surfaces means that in each case the size of the surfaces increases from one circuit board layer to a directly underlying circuit board layer or remains constant but does not decrease.

This results in the possibility of gradually enlarging the effective heat transfer area from top to bottom in the z-direction. In particular, heat can be efficiently removed from very small active electrical components in this manner, too.

This is particularly advantageous for the removal of heat from compact circuit boards with correspondingly small electrical components, in particular HDI circuit boards (HDI=High Density Interconnect) since only a relatively small number of vias can be arranged directly below small electrical components. Therefore, the inventive enlargement of the effective heat transfer area is particularly effective.

According to a preferred realization of the invention, some vias are first blind vias that connect at least one thermally conductive layer of the topmost circuit board layer to at least one thermally conductive layer of an underlying circuit board layer, thereby thermally contacting the topmost circuit board layer with an underlying circuit board layer in an advantageous manner. In particular, the first blind vias may be realized in the form of microvias, which is particularly advantageous for HDI circuit boards.

Furthermore, some vias are preferably second blind vias that connect at least one thermally conductive layer of the bottommost circuit board layer to at least one thermally conductive layer of a circuit board layer lying above so that it is possible to conduct heat from the interior of the circuit board to the bottommost circuit board layer, via which the heat can be conducted to the outside. The second blind vias too may be realized in the form of microvias, which is again particularly advantageous for HDI circuit boards.

Furthermore, some vias are preferably buried vias, each of them connecting thermally conductive layers of at least two different circuit board layers to each other, whereby it is possible to conduct the heat through the interior of the circuit board in an advantageous manner, wherein the arrangement, the size and the design of the buried vias of the circuit board geometry may be adapted.

Preferably, the first blind vias and/or the second blind vias and/or the buried vias are microvias so that as many vias as possible can be arranged in a small area.

Preferably, at least one via is formed as a sleeve-like via, i.e., as an enveloping hollow body. Forming vias as sleeve-like vias advantageously reduces the weight of the circuit board and reduces the amount of material required for manufacturing the circuit board and the corresponding material costs.

According to an advantageous further development of the invention, recesses for accommodating the first blind vias and/or the second blind vias and recesses for accommodating the buried vias are formed in the circuit board layers in a z-direction perpendicularly to the circuit board layers, said recesses for the blind vias having a diameter of between 100 µm and 150 µm and said recesses for the buried vias having a diameter of at least 250 µm, i.e., the circuit board is an HDI technique circuit board (HDI=High Density Interconnect). As against standard circuit boards, multilayer HDI circuit boards are characterized by a smaller drilled-hole diameter for accommodating the vias so that a higher number of vias per area is possible. This results in increased current-carrying capacity and particularly in improved heat removal.

According to an advantageous further development, the thermally conductive layers of the circuit board layers and/or walls of the vias are made of copper. This results in the inventive circuit board being characterized by increased current-carrying capacity as against ceramic substrates that have electrical conductors imprinted in the form of pastes.

In particular, the circuit board can be used for gearbox controllers. To this end, the circuit board is integrated in a control unit or device, wherein pumps or motors can be driven at increased currents ranging from 15 A to 50 A and higher on account of the high current-carrying capacity of the circuit board.

As against solutions known from the state of the art in which the conductor structures can be created in a very costly manner using special substrates (particularly by direct copper bonding) for realizing such a current-carrying capacity on the ceramic circuit carriers, the circuit boards have a particularly high current-carrying capacity since the thermally conductive layers and/or strip conductors are made of copper. The thermally conductive layers can be created particularly easily as copper layers having different layer thicknesses so that they can be adapted to the required use and to the required current-carrying capacity particularly easily, wherein copper layer thicknesses of 35 µm and 70 µm, but also greater copper layer thicknesses ranging from 200 µm to 400 µm, can be created and obtained, for example. On account of this circuit board design, current-carrying capacities that are very much higher than those of ceramic circuit carriers can be realized, wherein current-carrying capacities of up to 100 A and higher are possible. Furthermore, the good thermal conductivity of copper is made use of to remove heat from the circuit board since the thermally conductive layers of the circuit board layers and/or walls of the vias are made of copper.

In addition, the thermally conductive layers of the circuit board layers and/or the walls of the vias are advantageously plated with a multifunctional additional metallization layer having a sequence of films (e.g., nickel, palladium and gold) so that it is possible to populate the circuit board with casing-less semiconductor components together with passive components (bare die population). To this end, the outer copper surface of the thermally conductive layers and/or of the walls of the vias is plated with the additional metallization layer, wherein the additional metallization layer is at the same time suitable for mounting processes by means of soldering, adhesive bonding using conductive silver adhesives and connecting techniques, such as gold and/or aluminum wire bonding.

High reliability ratings, especially for the gold and/or aluminum wire bond connections, can be achieved by the described optimization of the manufacturing process of the circuit board and by the additional metallization of the outer layers of the circuit board.

In particular, the circuit board may have at least one active electrical component arranged on the topmost circuit board layer and/or at least one passive electrical component arranged on the topmost circuit board layer, thereby enabling the thermally conductive bridge made up of the vias and the thermally conductive layers to be advantageously used to remove heat that is emitted by the at least one electrical component.

Preferably, a second thermally conductive adhesive layer is provided that firmly bonds the at least one active electrical component to the topmost circuit board layer so that the at least one active electrical component and/or passive electrical component is thermally conductively fixed to the topmost circuit board layer in a simple manner.

Furthermore, the topmost circuit board layer preferably has a thermally conductive layer facing the at least one electrical component. The surface of said thermally conductive layer is larger than a surface of the at least one active electrical component facing it. Thus, the topmost circuit board layer has a thermally conductive layer adjacent to the at least one active electrical component, by means of which thermally conductive layer heat that is emitted by the at least one electrical component can be absorbed. Furthermore, this thermally conductive layer is larger than the surface of the at least one electrical component facing it, whereby heat that is emitted by the at least one electrical component is distributed over a larger surface area of this thermally conductive layer and the thermal capacity of the topmost circuit board layer is increased advantageously.

According to a particularly preferred further development, a heat sink arranged under the bottommost circuit board layer and a first thermally conductive adhesive layer that firmly bonds the heat sink to the bottommost circuit board layer are provided.

In order to be capable of removing the heat from the circuit board particularly efficiently, the thickness of the first thermally conductive adhesive layer must be as small as possible, in particular smaller than 100 µm. It is only possible to realize such layer thicknesses across the entire surface of the circuit board if the deflection of the circuit board is smaller than the thickness of the thermally conductive adhesive layer. This is achieved by specific layer construction and by layout optimization measures, such as evenly distributing the copper on all levels.

For example, the heat sink may be in the form of a heat conducting plate, e.g., a heat conducting plate made of aluminum. By means of the first thermally conductive adhesive layer, the heat sink is thermally conductively fixed to the bottommost circuit board layer in a simple manner.

According to a suitable further development, the circuit board is completely surrounded, on a side facing away from the heat sink, by a sealing material, and the at least one electrical component is arranged completely within the sealing material so that the entire circuit carrier is advantageously protected from external mechanical, thermal and chemical influences. In particular, the sealing material is a silicone gel and/or a silicone varnish so that a "soft seal" is formed. Such a soft seal is characterized by high thermal expansion and, at the same time, by a low modulus of elasticity. Therefore, it is suitable for the protection of the circuit carrier even at high temperatures.

Furthermore, strip conductors preferably have a strip conductor width of at least 100 μm and/or dielectric layers have a layer thickness of at least 50 μm in order to achieve particularly good electrical, thermal and mechanical properties of the circuit carrier. In particular, reliability and lifetime requirements of the circuit board can be met by a specific adjustment of the basic circuit board layer structure, of the dimensioning of the strip conductor widths and of the distances between the strip conductors, of the dimensioning of the dielectric layer thicknesses between the copper layers and of the selection of the hole diameters of the vias.

In summary, the circuit board and the control unit are optimized in such a way that particularly the structure of the circuit board layers, the selection of the circuit board material and the combination of the vias in the individual layers are selected in such a way that the transfer of heat from the components through the circuit board to the heat sink or to a carrier plate is particularly effective and the functioning of the circuit board is guaranteed even at high outside temperatures. For the use in integrated gearbox controllers and in externally mounted gearbox control devices, very high (sometimes very specific) demands are made on the circuit board as a circuit carrier itself, but also on the population of the circuit carrier with casingless components.

As described above, these requirements concern operating temperatures of more than 170° C. for very long operating times, high thermomechanical stress and cycle loads for the circuit carrier, the components and the junctions. Furthermore, very high demands are made on the reliability of the junctions between the electrical components and the circuit board, especially when bond connections are used. Moreover, the existing oil vapors must be prevented from influencing the operation of the control unit and the circuit board with the electrical components, which circuit board is integrated in the control unit. Furthermore, the circuit board must be resistant to high-frequency vibrations and be capable of carrying electric currents of up to 100 A or higher.

These requirements are met by means of the inventive solution and the realizations thereof.

BRIEF DESCRIPTION OF THE DRAWINGS

In the following, exemplary embodiments of the invention will be explained in greater detail on the basis of drawings in which.

DETAILED DESCRIPTION OF EXAMPLE EMBODIMENTS OF THE INVENTION

Figure 1:
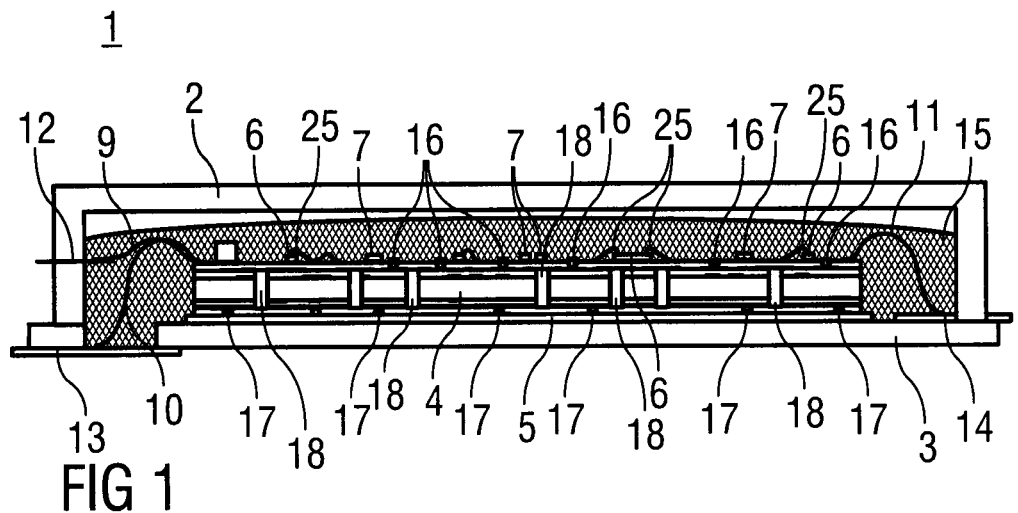
FIG. 1 schematically shows a sectional view of an inventive control unit for the use as an integrated mechatronic gearbox controller.

In all figures, alike reference numerals represent the same elements.

Figure 2:
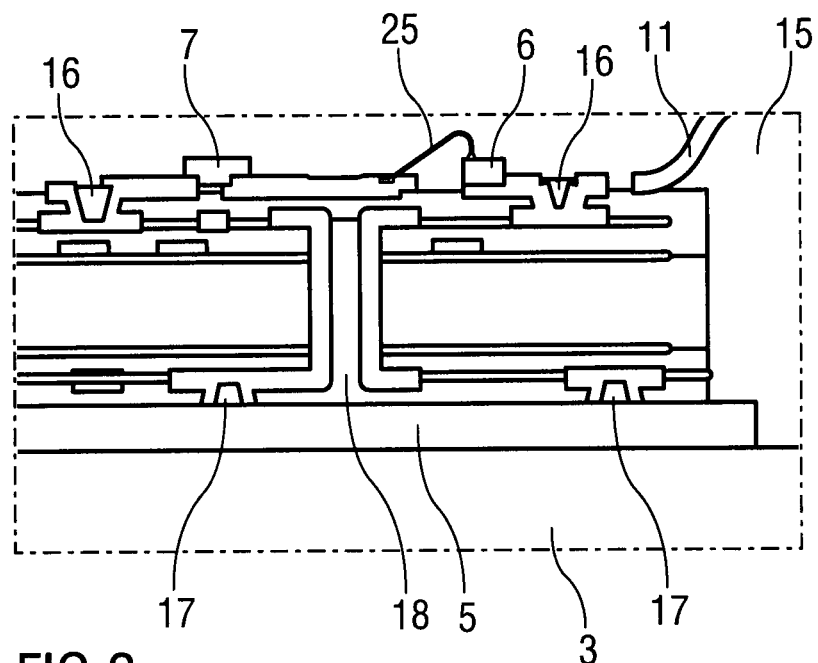
FIG. 2 schematically shows a detail drawing of a part of the control unit according to FIG. 1.

FIGS. 1 and 2 show an inventive control unit 1 for the use as an integrated mechatronic gearbox controller for a vehicle (not shown) in a sectional view and a detail drawing of a part of the control unit 1.

This so-called on-site electronic system can be created by the integration of the electronic control system and associated electronic components (e.g., sensors or valves) into the gearbox, wherein the electronic control system and the associated electronic components are not accommodated in a separate protected electronic-component space outside the gearbox. In order to protect the electronic control system and the associated electronic components from environmental influences and mechanical, thermal and chemical stress, they are accommodated in a casing 2 that in addition provides a shielding function. In addition, a heat sink 3 is provided for removing dissipated heat developing during the operation of the control unit 1.

The electronic control system and the associated electronic components comprise a multilayer circuit board 4 in the form of an HDI circuit board. The multilayer circuit board 4 comprises a plurality of circuit board layers arranged one over the other in a z-direction that are not explicitly shown and is thermally coupled to the heat sink 3 and fixed thereto by means of a first thermally conductive adhesive layer 5, wherein the maximum deflection of the circuit board 4 is smaller than the layer thickness of the first thermally conductive adhesive layer 5.

Figure 3:
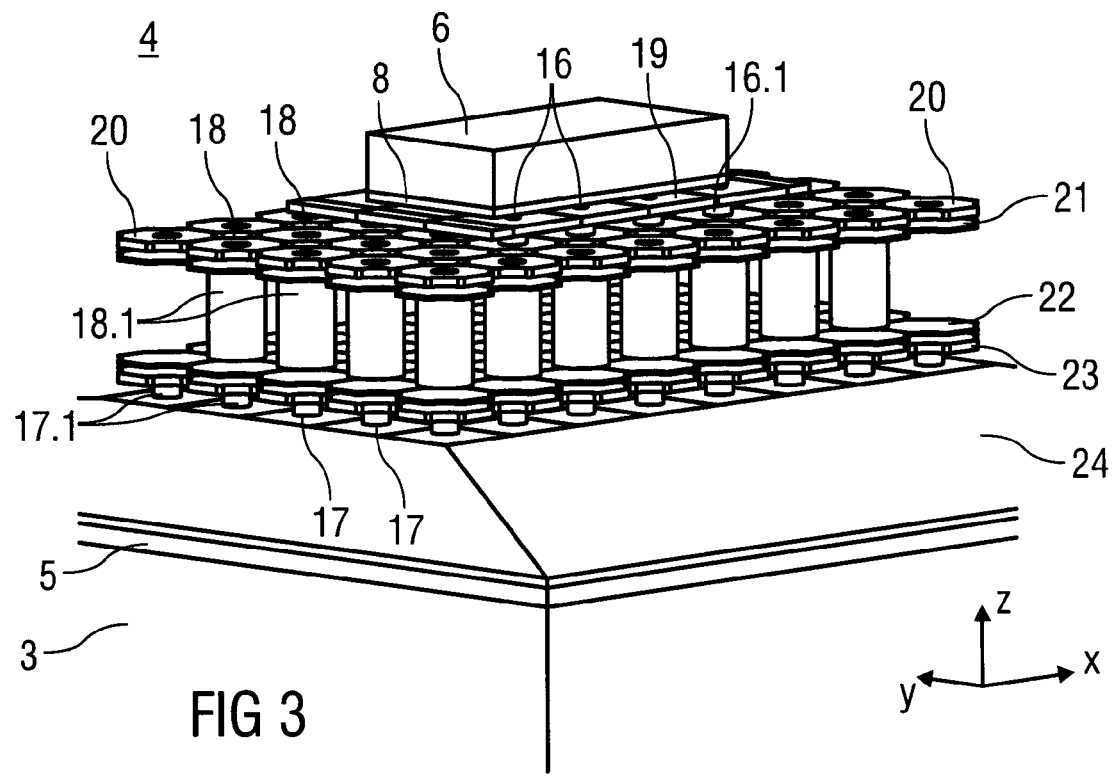
FIG. 3 schematically shows a perspective view of a copper skeleton of a multilayer circuit board with an active electrical component and several vias.
Figure 4:
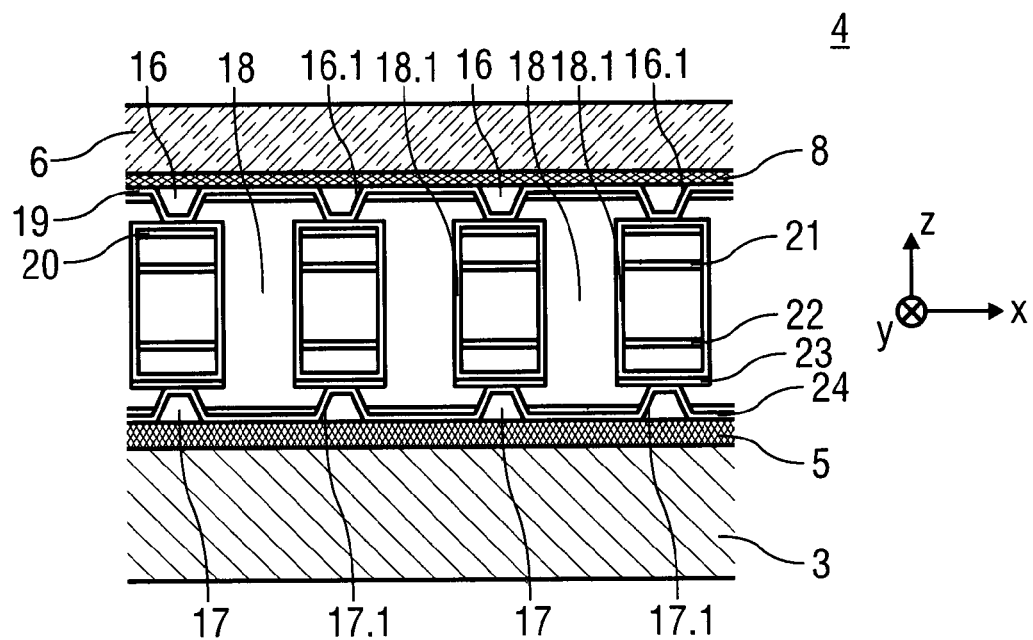
FIG. 4 schematically shows a part of a longitudinal section through the circuit board shown in FIG. 3.
Figure 5:
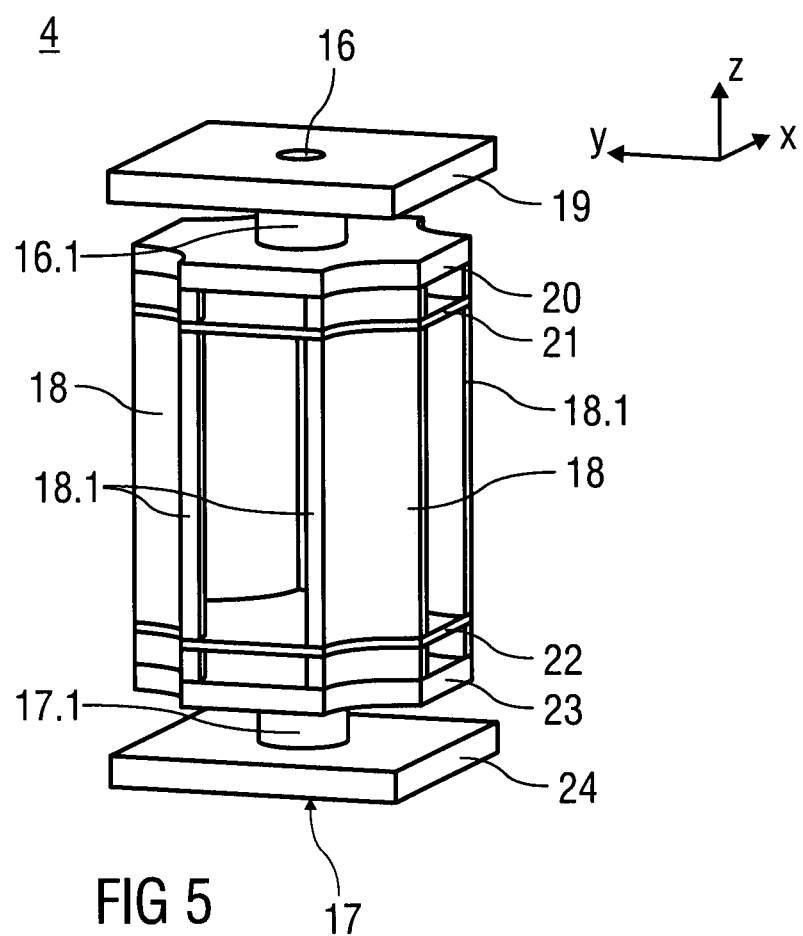
FIG. 5 schematically shows a perspective view of a part of the circuit board skeleton shown in FIG. 3 with a first and a second blind via and portions of four buried vias.

On a topmost layer of the circuit board 4, active electrical components 6 in the form of semiconductors and passive electrical components 7 in the form of semiconductors are arranged that are fixed to the topmost layer of the circuit board 4 by means of a second thermally conductive adhesive layer 8 that is shown in greater detail in FIGS. 3 to 5.

In order to contact the control unit 1 electrically, particularly in order to enable peripheral components to be connected to the control unit, the circuit board 4 is connected to a pressed screen 12 and flexible foil conductors 13, 14 by means of bonding wires 9 to 11, wherein the bonding wires 9 to 11 are aluminum or gold wire bond connections, in particular thick-wire bond connections.

In order to protect the electronic control system and the associated electronic components as well as the bond connections from mechanical, chemical and thermal influences, they are completely surrounded, within the casing 2, by an electrically insulating sealing material 15, wherein the sealing material 15 is formed as a soft seal made of silicone gel, which soft seal is characterized by high thermal expansion and, at the same time, by a low modulus of elasticity so that it is suitable for the protection of the components of the control unit 1 even at high temperatures. Furthermore, the use of the sealing material 15 makes the use of casingless electrical components 6, 7 possible.

In particular, a high stability of all electrical connections and a resistance of the components to oil vapors and to high-frequency vibrations and shocks are realized by means of the sealing compound.

In order to couple the topmost circuit board layer to the internal circuit board layers thermally and electrically, first blind vias 16 are provided. In order to couple the bottommost circuit board layer to the internal circuit board layers thermally and electrically, second blind vias 17 are provided. Said first and second blind vias are plated blind holes.

In order to couple the internal circuit board layers thermally and electrically, buried vias 18 are provided.

The blind vias 16, 17 and the buried vias 18 are used to improve the transfer of heat through the circuit board 4, particularly to remove heat from the circuit board 4 on account of the heat-emitting active electrical components 6.

In order to conduct heat between the individual circuit board layers, the circuit board layers each have at least one thermally conductive layer 19 to 24. The thermally conductive layers 19 to 24 are shown in greater detail in FIG. 4. For heat conduction, the thermally conductive layers 19 to 24 of different circuit board layers are connected to each other by means of the blind vias 16, 17 and the buried vias 18 in such a way that the blind vias 16, 17 and the buried vias 18 as well as the thermally conductive layers 19 to 24 form a thermally conductive bridge from the topmost circuit board layer to the bottommost circuit board layer.

The blind vias 16, 17 and the buried vias 18 are used to improve vertical heat conduction. In addition, metallic inlays, preferably copper inlays, may be used for heat removal (not shown).

In order to reduce line inductance and/or to increase current-carrying capacity, several blind vias 16, 17 and buried vias 18 for one connection are placed in parallel in the circuit board 4.

It is possible to switch from one strip conductor level to another in the multilayer circuit board 4 by means of the blind vias 16, 17 and the buried vias 18. This is a great advantage, particularly with respect to a good routing of complex circuits.

The blind vias 16, 17 have a diameter of between 100 µm and 150 µm and the buried vias 18 have a diameter of at least 250 µm, i.e., at least the blind vias 16, 17 are microvias that are preferably created by means of a laser.

On account of the high density of the arrangement of the blind vias 16, 17 and buried vias 18, the circuit board 4 is an HDI circuit board (HDI=High Density Interconnect).

In the exemplary embodiment shown, the multilayer circuit board 4 has a top outer circuit board layer with the blind vias 16 and a bottom outer circuit board layer with the blind vias 17, i.e., one microvia layer each. Between the microvia layers, several intermediate layers, preferably four or six intermediate layers, are arranged in the center of the circuit board 4, which intermediate layers are thermally connected to each other by means of the buried vias 18.

In order to guarantee a functioning of the control unit 1 even at high temperatures of more than 170° C. occurring in the gearbox of the vehicle, the circuit board layers are each made of a base material, the glass transition temperature of which is greater than or equal to 170° C.

The base material is an electrically insulating material and the thermally conductive layers 19 to 24 are applied to the base material. The base material is a glass-fiber reinforced plastic material with ceramic particles added thereto. Furthermore, the base material is characterized by an extremely good cycle stability of more than 2,000 cycles between −40° C. and +150° C. and by a very low thermal expansion. In order to achieve a thermal expansion in the z-direction of 30 ppm/K to 40 ppm/K, fillers, in particular ceramic particles, are added to the base material. The base material including the associated thermally conductive layer 19 to 24 has a layer thickness of at least 50 µm. The created strip conductors have strip conductor widths of at least 100 µm.

The thermally conductive layers 19 to 24 and the walls 16.1, 17.1, 18.1 of the blind vias 16, 17 and buried vias 18 are made of copper or coated with a copper layer. Said walls 16.1, 17.1, 18.1 are shown in greater detail in FIGS. 3 to 5.

Furthermore, in order to enable the circuit board 4 to be populated with casingless active components, i.e., with the active electrical components 6 together with the passive electrical components 7, the outer copper surface of the thermally conductive layers 19 to 24 is plated with an additional metallization layer in a manner not shown in greater detail. In order to create said additional metallization layer, a sequence of films (e.g., nickel, palladium and gold one after the other) is deposited in a currentless process, for example. The processes for mounting the casingless electrical components onto the circuit board 4 (in particular soldering or adhesive bonding using conductive silver adhesives) and the processes for electrically contacting the electrical components 6, 7 to the circuit board (preferably wire bonding techniques and/or flip-chip techniques for soldering) are made particularly reliable (or even made possible) by means of said additional or end metallization. In particular, wire bonding is performed by means of gold and/or aluminum wire.

Preferably, only casingless active and passive electrical components 6 are used in the control unit 1. Components that are accommodated in casings and that are soldered onto the circuit board 4 in order to be mechanically and electrically contacted thereto are not used since the heat they produce is poorly removed from them on account of the casing. In order to establish mechanical contact, the casingless active electrical components 6 are adhesively bonded onto the topmost circuit board layer by means of the second thermally conductive adhesive layer 8 that is made of conductive silver adhesive in particular. The electrical contact to the circuit board 4 is established by means of bonding wires 25.

FIG. 3 shows a perspective view of a copper skeleton of the circuit board 4 with six circuit board layers arranged one over the other, with an active electrical component 6 arranged on a topmost circuit board layer, and with several vias 16, 17, 18. As explained above, the circuit board 4 is an HDI circuit board.

The circuit board layers each have a thermally conductive plane layer 19 to 24. The thermally conductive layers 19 to 24 are arranged in planes that are parallel to each other and perpendicular to the z-direction. The thermally conductive layers 19 to 24 are each applied to the electrically insulating base material and made of copper.

The electrically insulating base material of each circuit board layer is a glass-fiber reinforced epoxy resin with ceramic particles added thereto, wherein the selection of the respective glass-fiber reinforced epoxy resin may depend on the circuit board layer, whereby the epoxy resin used can be advantageously adapted to the position of the respective circuit board layer within the circuit board and/or to the use thereof.

The electrically insulating base material fills the space between the thermally conductive layers 19 to 24 and the vias 16, 17, 18 and is not shown in FIG. 3. Therefore, the part of the circuit board 4 shown in FIG. 3 is referred to as the copper skeleton of the circuit board 4.

In particular, the active electrical component 6 is a casingless semiconductor chip that emits heat during operation. The active electrical component 6 is firmly bonded to the topmost circuit board layer by means of the second thermally conductive adhesive layer 8 that is a conductive silver adhesive layer, for example.

The heat sink 3 in the form of a heat conducting aluminum plate for absorbing heat from the circuit board 4 is arranged under the bottommost circuit board layer. The heat sink 3 is firmly bonded to the bottommost circuit board layer by means of the first thermally conductive adhesive layer 5. The first thermally conductive adhesive layer 5 may be realized in the form of a silicone adhesive filled with ceramic particles, for example.

FIG. 4 shows a part of a longitudinal section through the circuit board 4 shown in FIG. 3.

On its top side, the topmost circuit board layer has a first thermally conductive layer 19 facing a bottom of the active electrical component 6. The surface of the first thermally conductive layer 19 is larger than the surface of the bottom of the active electrical component 6. For reasons of clarity, the first thermally conductive layer 19 is shown in segments, wherein each segment is a square and has a first blind via 16 in the form of a microvia arranged below the active electrical component 6.

The first blind vias 16 are blind holes extending through the first thermally conductive layer 19 to the second thermally conductive layer 20 of the second circuit board layer that is arranged below the topmost circuit board layer. Each first blind via 16 is rotationally symmetrically formed around the z-direction and slightly tapered towards the second thermally conductive layer 20. The walls 16.1 of the first blind vias 16 are made of copper and connect the first thermally conductive layer 19 to the second thermally conductive layer 20. In the exemplary embodiment shown, each first blind via 16 has a diameter of approximately 150 μm at its upper end, and the first blind vias 16 are spaced approximately 500 μm apart, for example.

The surface of the second thermally conductive layer 20 is larger than the surface of the first thermally conductive layer 19, e.g., approximately twice as large. A third thermally conductive layer 21 of a third circuit board layer is arranged below the second thermally conductive layer 20. A fourth thermally conductive layer 22 of a fourth circuit board layer is arranged below the third thermally conductive layer 21. A fifth thermally conductive layer 23 of a fifth circuit board layer is arranged below the fourth thermally conductive layer 22. In this exemplary embodiment, the surfaces of the second, third, fourth and fifth thermally conductive layers 20 to 23 are the same size but may increase in size from top to bottom in other exemplary embodiments.

Several buried vias 18 extend from the second thermally conductive layer 20 to the fifth thermally conductive layer 23. The buried vias 18 are cylindrical hollow bodies with walls 18.1 made of copper that each connect the second, third, fourth and fifth thermally conductive layers 20 to 23 to each other. In particular, they have a diameter of approximately 250 μm.

The bottommost circuit board layer having on its bottom a sixth thermally conductive layer 24 facing the heat sink 3 is arranged below the fifth thermally conductive layer 23. The sixth thermally conductive layer 24 is connected to the fifth thermally conductive layer 23 by means of the second blind vias 17, wherein the design of the second blind vias 17 is the same as that of the first blind vias 16, i.e., the second blind vias 17 are blind holes extending through the sixth thermally conductive layer 24 to the fifth thermally conductive layer 23 with walls 17.1 made of copper that connect the sixth thermally conductive layer 24 to the fifth thermally conductive layer 23.

The surface of the sixth thermally conductive layer 24 is larger than the surface of the fifth thermally conductive layer 23, e.g., two to three times as large. The surface of the heat sink 3 facing the surface of the sixth thermally conductive layer 24 is at least as large as the surface of the sixth thermally conductive layer 24.

FIG. 5 shows a perspective view of a part of the skeleton of the circuit board 4 shown in FIG. 3 with the first blind vias 16, the second blind vias 17 and portions of four buried vias 18. In particular, FIG. 5 shows that the buried vias 18 are offset from the first and second blind vias 16, 17 in the x-direction and in the y-direction.

A specific structure of integrated gearbox controllers with multilayer (in particular HDI) circuit board solutions for extreme requirements can be realized by the described specific optimization of the circuit board technique, i.e., by the optimized materials, by the specific circuit board structure with an adapted dimensioning of the strip conductor widths, of the distances between the strip conductors, of the multifunctional end surface, of the dielectric layer thicknesses, by the optimized selection of the diameters of the vias 16, 17, 18 and of the bores required therefor as well as by the rugged design along with the use of the circuit board base materials.

LIST OF REFERENCE NUMERALS 1 control unit
2 casing
3 heat sink
4 circuit board
5 first thermally conductive adhesive layer
6 active electrical component
7 passive electrical component
8 second thermally conductive adhesive layer
9 bonding wire
10 bonding wire
11 bonding wire
12 pressed screen
13 foil conductor
14 foil conductor
15 sealing material
16 via, first blind via
16.1 wall
17 via, second blind via
17.1 wall
18 via, buried via
18.1 wall
19 thermally conductive layer
20 thermally conductive layer
21 thermally conductive layer
22 thermally conductive layer
23 thermally conductive layer
24 thermally conductive layer
25 bonding wire

The invention claimed is:

1. A circuit board being a High-Density-Interconnect HDI circuit board comprising a plurality of circuit board layers arranged one over the other, characterized in that the circuit board layers each comprise an electrically insulating base material comprising a glass fiber reinforced plastic with an incorporated filler material, the glass transition temperature of which base material being greater than or equal to 170° C., and that the circuit board layers each have at least one thermally conductive layer applied to the electrically insulating base material, wherein several vias extending in a z-direction perpendicularly to the circuit board layers are provided, which vias connect the thermally conductive layers of different circuit board layers in such a way that the vias and the thermally conductive layers of the circuit board layers form a thermally conductive bridge from a topmost circuit board layer to a bottommost circuit board layer, wherein a total surface area of all the at least one thermally conductive layer of a selected circuit board layer is larger than a total surface area of all the at least one thermally conductive layer of another circuit board layer above the selected circuit board layer.

2. The circuit board according to claim 1, wherein the filler material comprises ceramic particles.

3. The circuit board according to claim 1, having at least one of the following features:
  a first feature wherein first ones of the vias are first blind vias that connect at least one thermally conductive layer of the topmost circuit board layer to at least one thermally conductive layer of an underlying circuit board layer, a second feature wherein second ones of the vias are second blind vias that connect at least one thermally conductive layer of the bottommost circuit board layer to at least one thermally conductive layer of a circuit board layer lying thereabove, and a third feature wherein third ones of the vias are buried vias that each connect thermally conductive layers of at least two different circuit board layers to each other.

4. The circuit board according to claim 3, characterized in that at least some of the vias are microvias.

5. The circuit board according to claim 3, characterized in that at least one of recesses for accommodating the first blind vias and recesses for accommodating the second blind vias, and recesses for accommodating the buried vias, are formed in the circuit board layers in a z-direction perpendicularly to the circuit board layers, said recesses for the blind vias having a diameter between 100 μm and 150 μm, and said recesses for the buried vias having a diameter of at least 250 μm.

6. The circuit board according to claim 1, characterized in that the thermally conductive layers of the circuit board layers, or walls of the vias, or both the thermally conductive layers and the walls, are made of copper.

7. The circuit board according to claim 6, characterized in that the thermally conductive layers of the circuit board layers, or the walls of the vias, or both the thermally conductive layers and the walls, are plated with a multifunctional additional metallization layer having a sequence of films selected from nickel, palladium and gold.

8. The circuit board according to claim 1, further comprising at least one electrical component arranged on the topmost circuit board layer.

9. The circuit board according to claim 1, characterized by a heat sink arranged under the bottommost circuit board layer and by a first thermally conductive adhesive layer that firmly bonds the heat sink to the bottommost circuit board layer, wherein a maximum deflection of the circuit board is smaller than a layer thickness of the first thermally conductive adhesive layer.

10. The circuit board according to claim 9, further comprising at least one electrical component arranged on the topmost circuit board layer, and further characterized in that the circuit board is completely surrounded, on a side facing away from the heat sink, by a sealing material, and the at least one electrical component is arranged completely within the sealing material.

11. A control unit for vehicle applications, comprising the circuit board according to claim 1 in combination with at least one further component.

12. The control unit according to claim 11, being an integrated mechatronic gearbox controller of a motor vehicle.

13. A circuit board comprising:
plural circuit board layers including a first circuit board layer, a third circuit board layer arranged below said first circuit board layer, and a second circuit board layer arranged between said first and third circuit board layers; and plural vias that each respectively penetrate through at least a respective one of said circuit board layers;

wherein:
each said circuit board layer respectively comprises an electrically insulating base material comprising a glass fiber reinforced plastic further incorporating a filler material, wherein said base material has a glass transition temperature greater than or equal to 170° C.;

each said circuit board layer respectively further comprises at least one thermally conductive layer applied to said base material;

said vias thermally interconnect said thermally conductive layers of different ones of said circuit board layers with one another such that said vias and said thermally conductive layers together form a continuous thermally conductive path from a topmost one of said circuit board layers to a bottommost one of said circuit board layers;

a first total area of said at least one thermally conductive layer of said first circuit board layer is smaller than a second total area of said at least one thermally conductive layer of said second circuit board layer; and said second total area is smaller than a third total area of said at least one thermally conductive layer of said third circuit board layer.

14. The circuit board according to claim 13, further. comprising an electronic component arranged and mounted on top of said first circuit board layer and a heat sink arranged and mounted on a bottom of said third circuit board layer, wherein said electronic component is thermally conductively connected through said thermally conductive path to said heat sink.

15. The circuit board according to claim 13, wherein said third total area is two to three times larger than said second total area, or said second total area is two to three times larger than said first total area.

16. The circuit board according to claim 13, wherein said third total area is two to three times larger than said second total area which is two to three times larger than said first total area.

17. The circuit board according to claim 13, wherein none of said vias penetrate through all of said circuit board layers.

18. The circuit board according to claim 13, wherein said vias include blind first vias in said first circuit board layer, buried second vias in said second circuit board layer, and blind third vias in said third circuit board layer, wherein said first vias are laterally offset from said second vias, and wherein said third vias are laterally offset from said second vias.

19. The circuit board according to claim 13, wherein said circuit board is configured and dimensioned as a High-Density-Interconnect HDI circuit board.

20. The circuit board according to claim 13, further comprising an additional circuit board layer arranged between said first and third circuit board layers.

* * * * *